United States Patent
Braxton

[11] Patent Number: 6,134,121
[45] Date of Patent: Oct. 17, 2000

[54] HOUSING ASSEMBLY UTILIZING A HEAT SHRINKABLE COMPOSITE LAMINATE

[75] Inventor: Thomas Ray Braxton, Boynton Beach, Fla.

[73] Assignee: Motorola, Inc., Schaumburg, Ill.

[21] Appl. No.: 09/017,563

[22] Filed: Feb. 2, 1998

[51] Int. Cl.[7] .................................................. H05K 9/00
[52] U.S. Cl. .......................................................... 361/818
[58] Field of Search ........................... 361/818; 439/607, 439/76.1; 174/35 MS

[56] References Cited

U.S. PATENT DOCUMENTS

| | | | |
|---|---|---|---|
| 4,227,037 | 10/1980 | Layton | 174/35 MS |
| 5,005,106 | 4/1991 | Kiku | 174/35 C |
| 5,166,864 | 11/1992 | Chitwood et al. | 174/35 MS |
| 5,394,304 | 2/1995 | Jones | 174/35 |
| 5,436,803 | 7/1995 | Annis | 361/818 |
| 5,557,064 | 9/1996 | Isern-Flecha et al. | 361/818 |
| 5,563,450 | 10/1996 | Bader et al. | 361/818 |
| 5,689,878 | 11/1997 | Dahringer et al. | 361/818 |
| 5,739,463 | 4/1998 | Diaz et al. | 361/818 |
| 5,761,054 | 6/1998 | Kuhn | 361/818 |

OTHER PUBLICATIONS

Shrink Mate Conductive Heat Shrink Connectors Data Sheet, Methode Devolpment Co., a subsidiary of Methode Electronics, Inc., Chicago, IL.

*Primary Examiner*—Neil Abrams
*Attorney, Agent, or Firm*—Philip P. Macnak

[57] ABSTRACT

A housing assembly includes a printed circuit board (PCB) (104), at least one electrical component (106) mounted on at least one side of the PCB (104) and electrically coupled thereto, a frame (102, 108) surrounding selected portions of the PCB (104), and a heat shrinkable composite laminate (110) having an inner conductive surface (115) and a non-conductive outer surface (140). The laminate (110) forms an enclosure supported by the frame (102, 108) about the PCB (104) and the at least one electrical component (106). The laminate outer surface (140) can be conductively coated and a contact (109) fixed to the PCB (104) can be used for electrically coupling to the inner conductive surface (115). The laminate (110) can include orifices (111, 130) for a connector (107) and an antenna (113). In other embodiments (FIGS. 9, 10) a heat shrinkable composite laminate (120) can be electrically joined to a metal shell of a component (106) which is grounded through a pin (118) or the laminate outer surface (144) can be grounded to a metal cover.

15 Claims, 9 Drawing Sheets

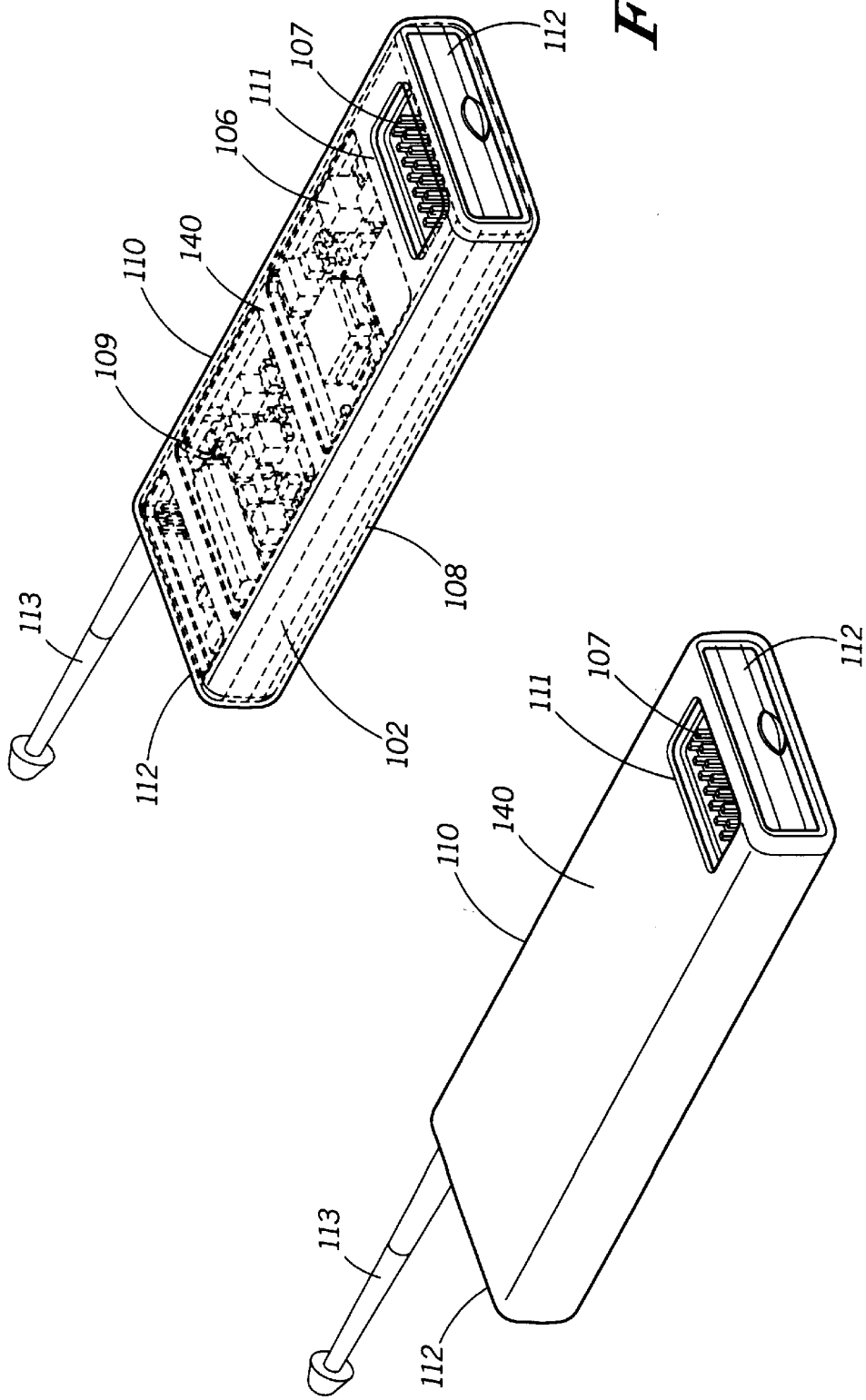

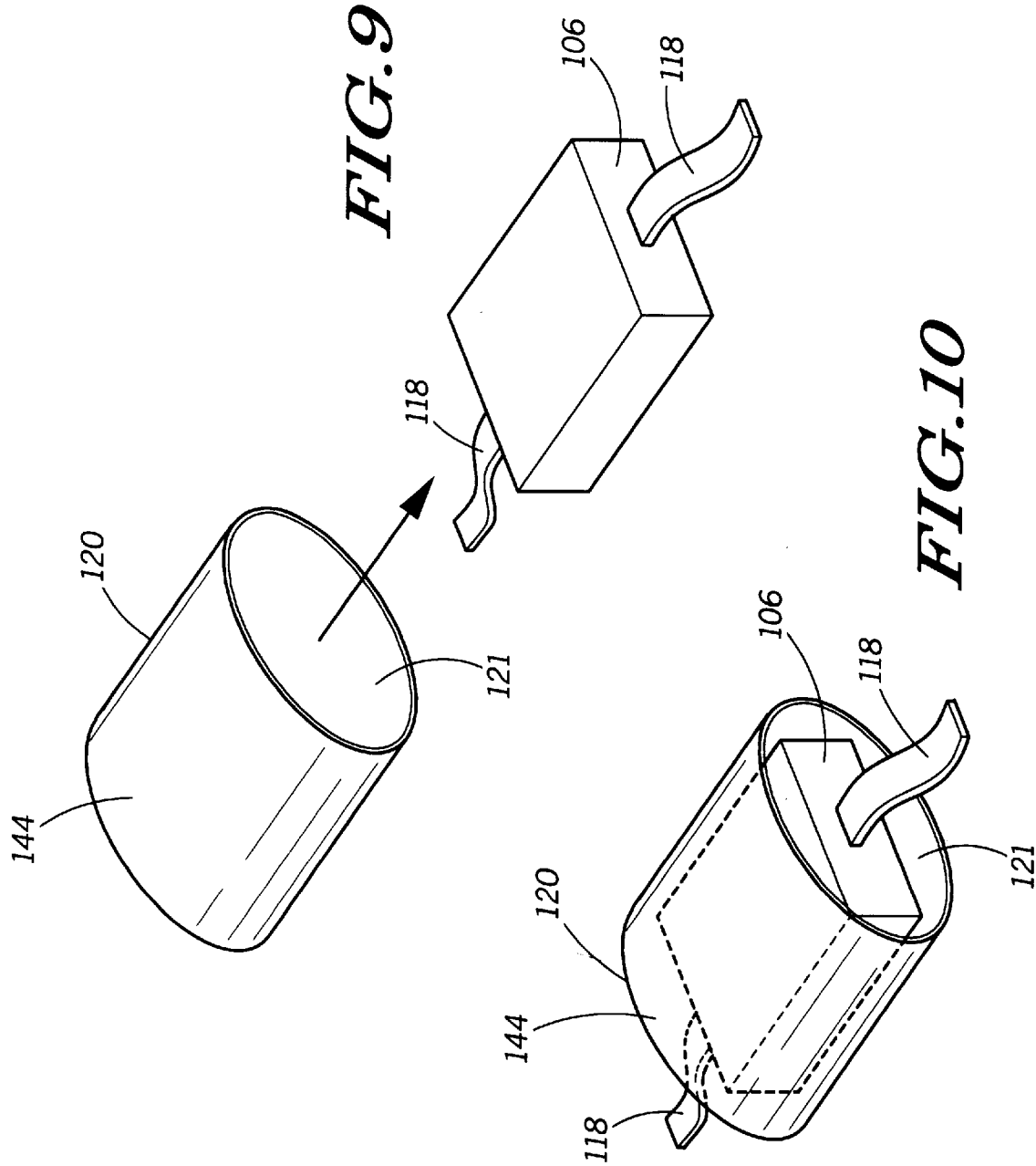

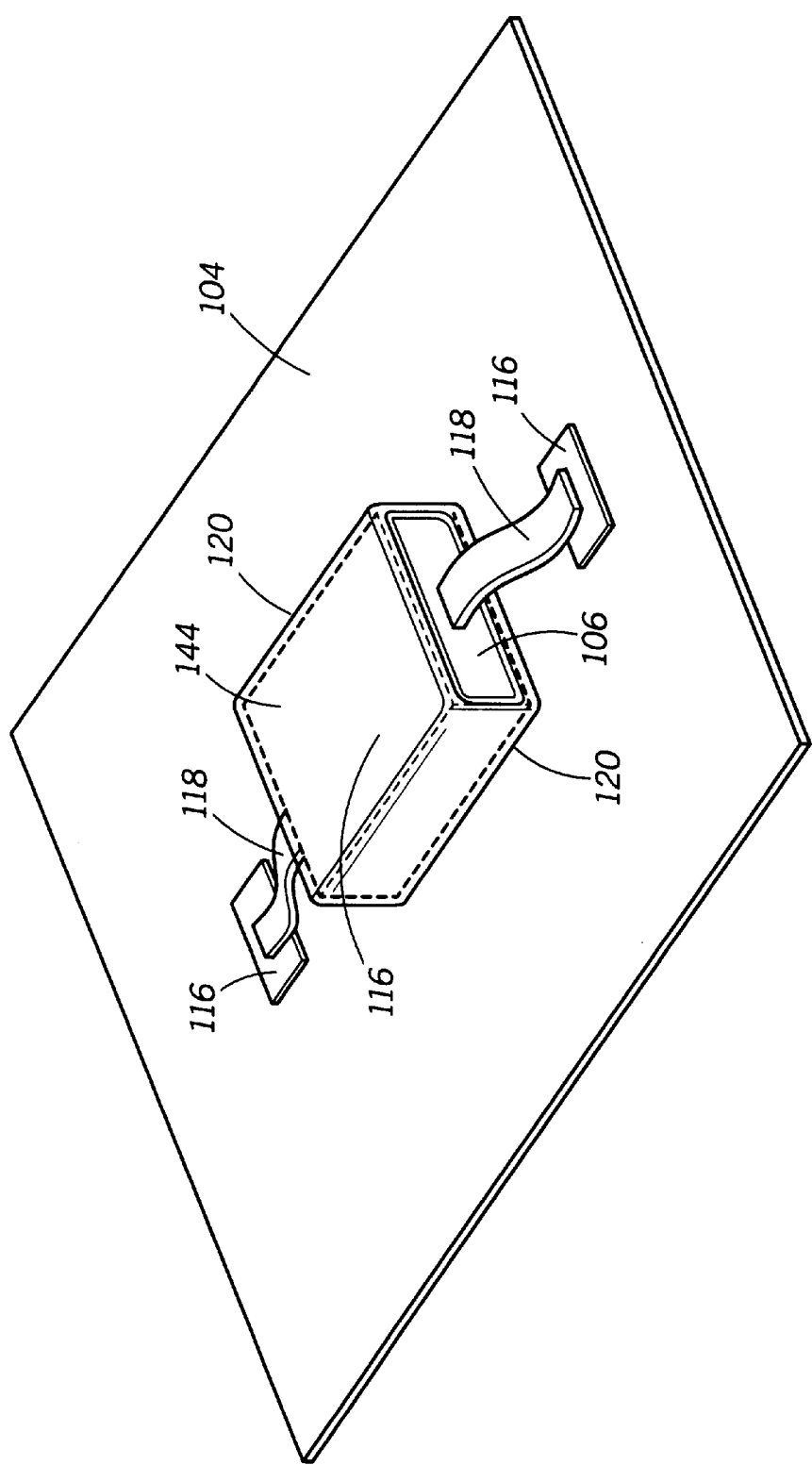

HOUSING ASSEMBLY UTILIZING A HEAT SHRINKABLE COMPOSITE LAMINATE

FIELD OF THE INVENTION

This invention relates in general to portable radio communications, and particularly, to an assembly that shields EMI (electromagnetic interference) and that enhances the performance of a radio antenna of a selective call unit.

BACKGROUND OF THE INVENTION

It is well-known in the art that electronic devices which generate signals operating at high frequency (i.e., fast periodic signals or signals with fast transitions) disperse electromagnetic radiation as a natural byproduct. In some applications the electromagnetic radiation is tolerable, and thereby ignored. In other applications, however, radiation can cause signal distortion within the circuitry of a selective call unit to the extent that a unit malfunction may result. Additionally, unabated radiation may in some instances violate EMI regulations of the FCC (Federal Communications Commission).

Presently, prior art systems use, for example, a metallic shielding process for encapsulating electronic devices as a method for attenuating harmful electromagnetic radiation. Typically, a metallic shielding process involves either the drawing or forming of metal covers which are then used to encapsulate the electronic device. The cost of drawing or forming metal covers with die machines and/or cutters is an expensive manufacturing process. In many instances, the assembly process for installing metal covers on an electronic device is not accurate. As a result, intolerable levels of radiation may remain.

These disadvantages in the prior art are exacerbated when shielding is required for an entire PCB (printed circuit board), due to high-speed signals routed throughout the PCB that radiate intolerable levels of EMI. Shielding large PCB's requires substantially larger metallic covers, which are yet more difficult to seal during assembly. As a result of these limitations in the prior art, manufacturing throughput is generally slow and costly.

Accordingly, what is needed is an apparatus that functionally performs the intended functions of the prior art, and that overcomes the foregoing disadvantages described.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

FIGS. 1–4 show block diagrams of a first embodiment of an assembly that shields EMI generated by electrical components and that contemporaneously enhances the performance of a radio antenna according to the present invention;

FIGS. 9–11 show block diagrams of a third embodiment of an assembly that shields EMI generated by electrical components according to the present invention.

DESCRIPTION OF THE PREFERRED EMBODIMENTS

Figure 1:
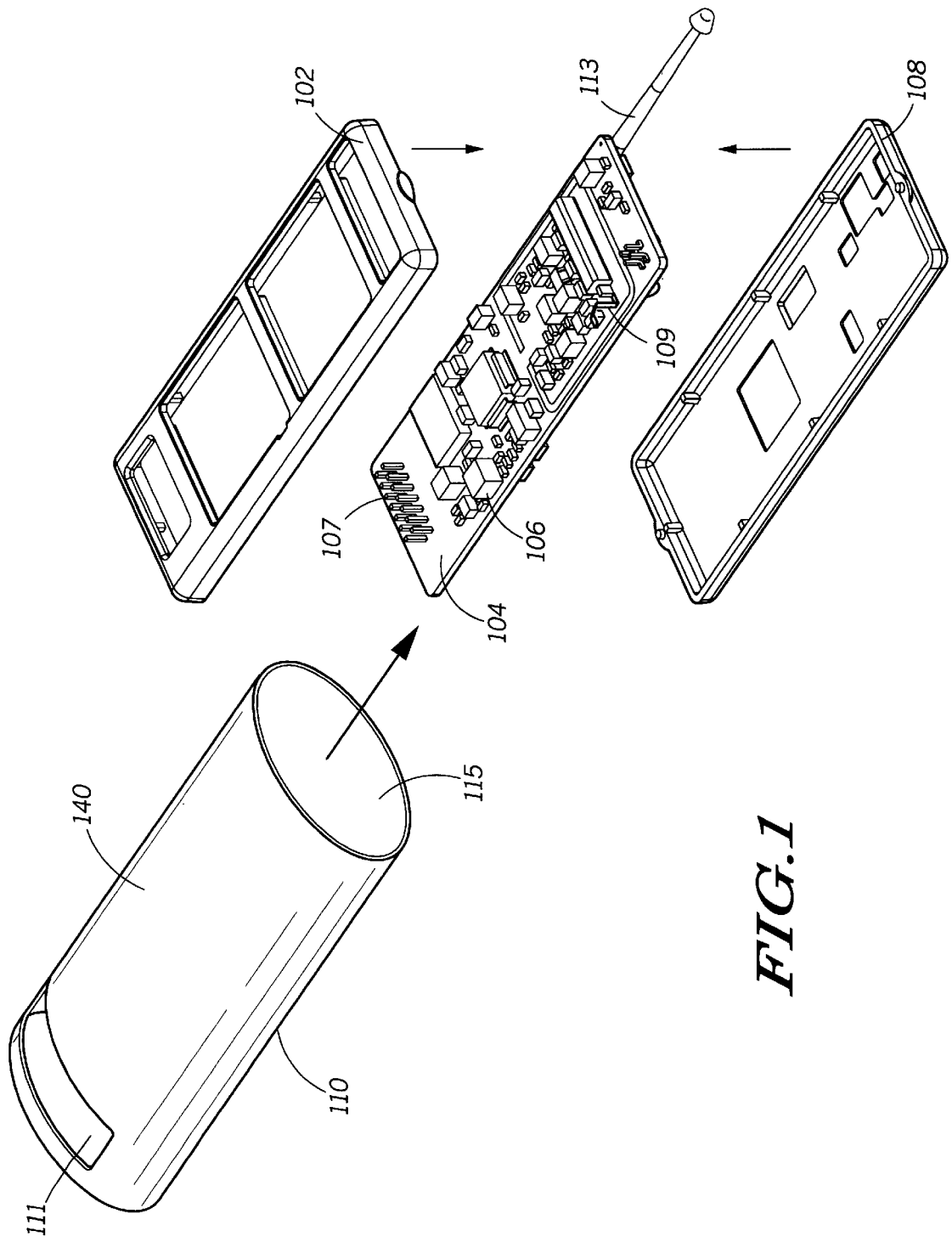

FIGS. 1–4 show block diagrams of a first embodiment of an assembly that shields EMI generated by electrical components 106 and that contemporaneously enhances the performance of a radio antenna 113 according to the present invention. The assembly of FIG. 1 comprises a PCB (printed circuit board) 104 with a plurality of electrical components 106, a conventional electrical connector 107 mounted thereon, and the antenna 113 coupled thereto. The assembly further comprises front and back covers 102, 108 for enclosing the PCB 104. Note, FIG. 1 illustrates electrical components 106 mounted on both sides of the PCB 104. Alternatively, however, the design of the PCB 104 may have been limited to a single-sided PCB where the electrical components 106 are mounted on only one side of the PCB 104. It will be appreciated that the PCB 104 may comprise a flexible substrate constructed with a polyimide substrate or a polyester substrate.

Together, the electrical components 106 shown in FIG. 1 embody a selective call receiver (SCR) or, alternatively, a selective call transceiver (SCT), each of which will be described later (see FIG. 12). For clarity, the discussions that follow will refer only to an SCR, although it should be apparent that the same discussions apply to a SCT. It is worth noting here, however, that a SCR and a SCT generally include a substantial number of electrical components which radiate EMI. Not surprisingly, if this radiation is left unsuppressed it could lead to an FCC violation for excessive EMI in the environment, or worse, it may cause signal distortions in certain portions of the PCB 104 that could cause a circuit malfunction of the SCR or SCT.

To substantially eliminate radiation, the assembly further includes at least one conductive contact 109 which is designed for coupling with a shrinkable composite laminate enclosure 110 having an inner surface 115 laminated with a conductive material such as, for example, silver ink. The shrinkable composite laminate 110 is preferably comprised of a polymer film that shrinks when exposed to heat at or above a predetermined temperature (e.g., 120° Celsius). The conductive contact 109 is preferably coupled to a ground signal somewhere on the PCB 104 which can be traced to one or more of the electrical components 106. The ground signal could also be derived from a ground plane included in one of the layers of the PCB 104. In a battery operated SCR, the ground signal can be traced back to the negative terminal of the battery. As shown in FIG. 1, the shrinkable composite laminate 110 also includes an aperture 111 to expose the connector 107 after assembly. With an exposed connector 107, the SCR can be used, for example, as an accessory that couples to an external electrical device for communication thereto.

In the present example, the antenna 113 is preferably coupled to the ground signal. Since the shrinkable composite laminate 110 is coupled to ground by way of contact 109 after assembly, the shrinkable composite laminate 110 can serve as a cylindrical ground plane for the antenna 113. As a ground plane, the shrinkable composite laminate 110 can be used for improving the RF (radio frequency) performance of the antenna 113. In addition to improving the performance of the antenna 113, the enclosing the SCR with the shrinkable composite laminate 110 helps to substantially eliminate the effect of EMI.

Figure 2:
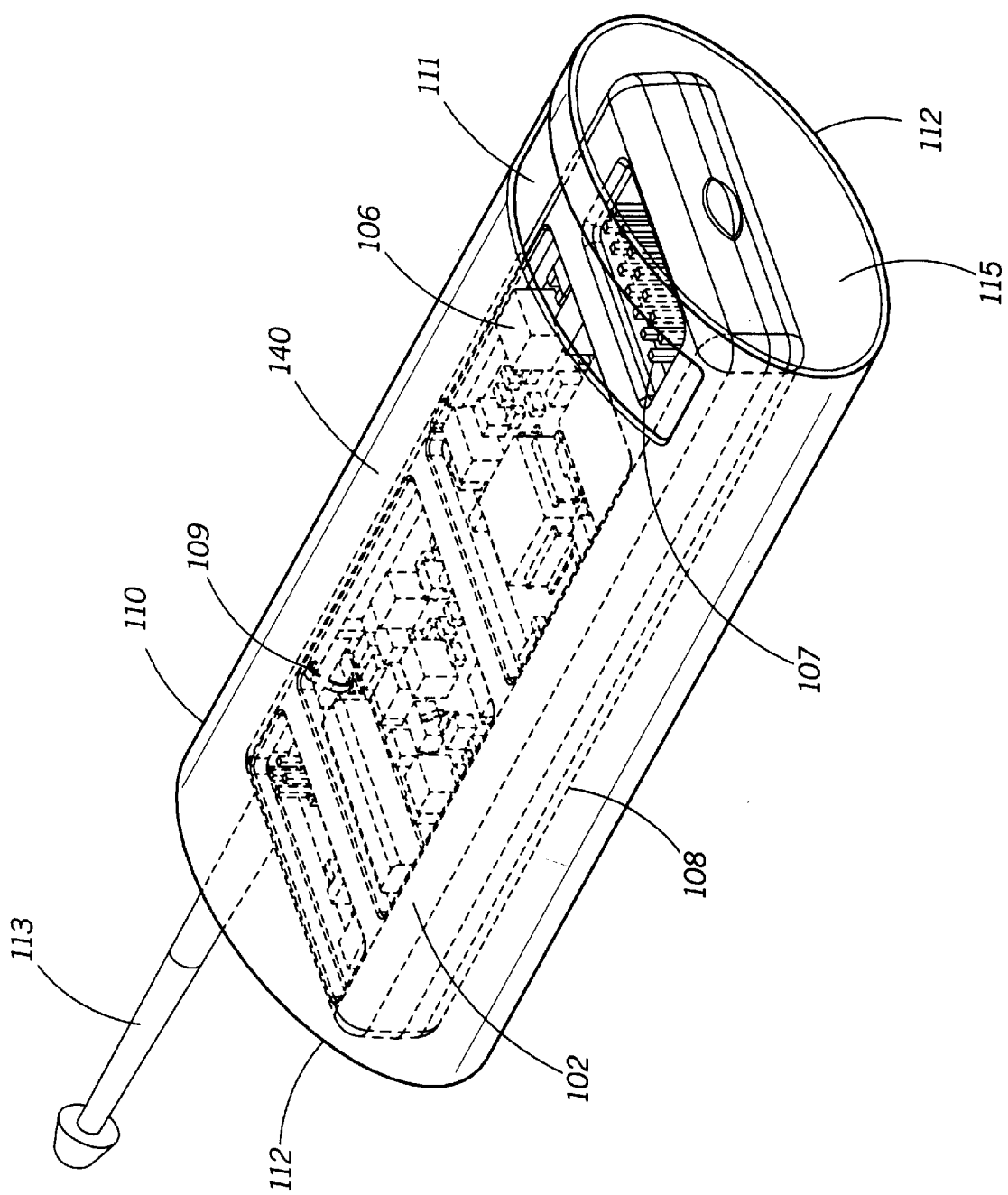
Figure 5:
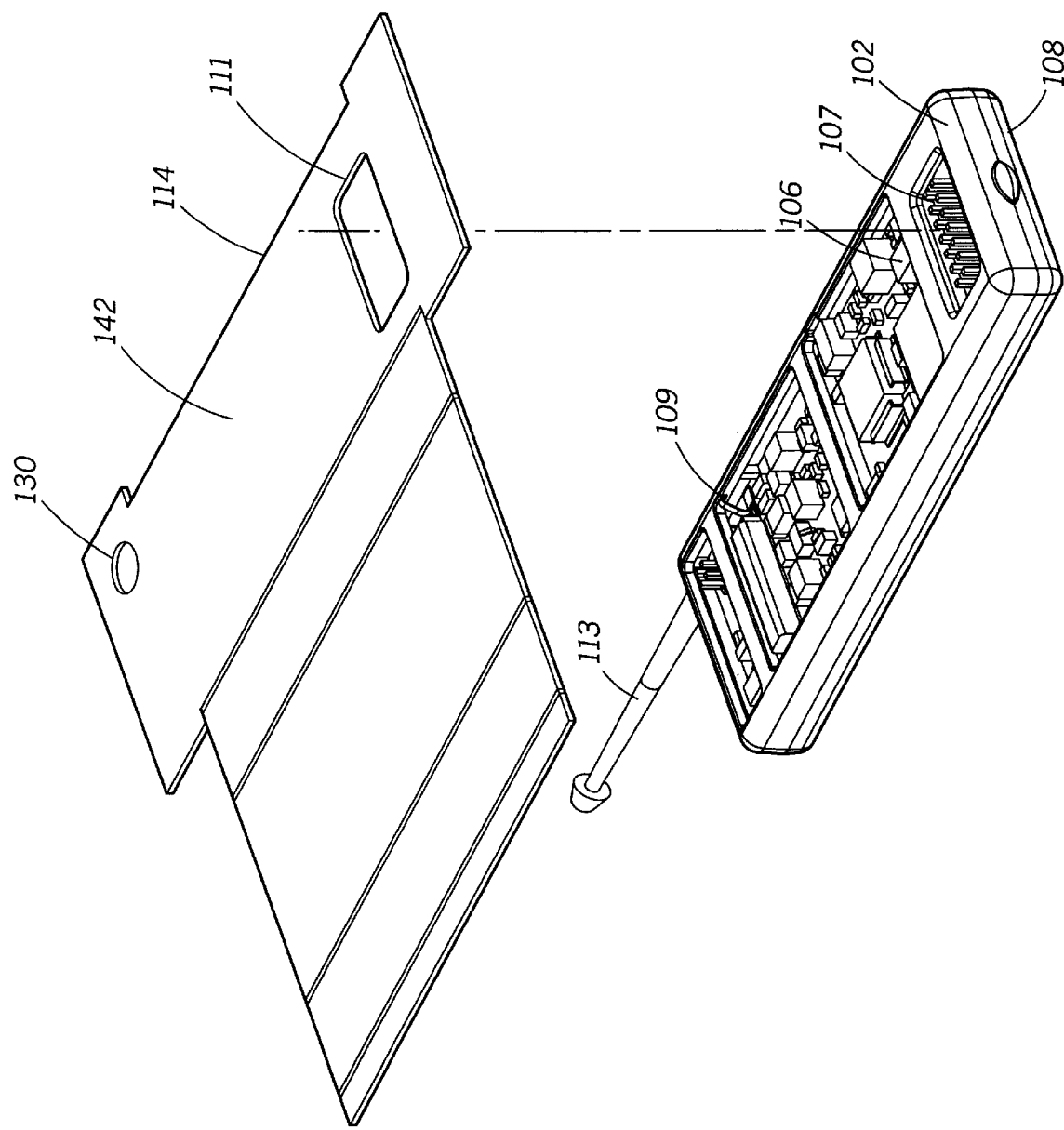
FIGS. 5–8 show block diagrams of a second embodiment of an assembly that shields EMI generated by electrical components and that contemporaneously enhances the performance of a radio antenna according to the present invention.

Turning now to the assembly process, FIG. 2 shows the SCR after it has been inserted into the shrink composite laminate 110. FIGS. 3 and 4 shows the shrink composite laminate 110 conforming to the SCR after it has been exposed to conventional heat. After this assembly step, the conductive contact 109 electrically couples to the inner surface 115 of the shrink composite laminate 110, thereby grounding it to the SCR.

As should be apparent from FIG. 4, the shrink composite laminate 110 does not hermetically seal the SCR. The two orifices 112 at each end of the shrink composite laminate 110 plus the aperture 111 remain exposed and are therefore potential sources of EMI. Depending on the carrier frequency used by the SCR, the orifices 112 may perform the function of a wave guide, which in turn attenuate electromagnetic radiation to tolerable levels, thereby eliminate the need to further shield the SCR. If, however, this were not the case, the orifices 112 may be sealed with, for example, a conductive epoxy material to eliminate the EMI leakage. EMI radiation by way of the aperture 111 is reduced once the SCR is mated with an external device such as, for example, a PDA (personal digital assistant) such as the Palm Pilot™. To further reduce EMI leakage from the connector 107, electrical components 106 and high-speed signals on the PCB 104 known to generate EMI can be kept clear of the connector 107.

Based on the foregoing descriptions, it will be appreciated that, alternatively, more than one conductive contact 109 may be used across different portions of the PCB 104 to minimize parasitic effects caused by a single contact. It will also be appreciated that, alternatively, the shrinkable composite laminate 110 may also be laminated with conductive material on its outer surface 140, which is useful, for example, to couple the shrinkable composite laminate 110 with an external frame or cover that has access to another voltage potential or the same ground signal coupled to the inner surface. It will be further appreciated that a voltage potential other than ground may be used for coupling to one or both of the conductive surfaces of the shrinkable composite laminate 110.

Electromagnetic interference can be described as a combination of two components of interference: electric fields and magnetic fields—commonly referred to as E-fields and H-fields, respectively. The effect that the shrinkable composite laminate 110 has on these fields depends on the type of conductive material that is laminated on its surfaces. For example, laminating the shrinkable composite laminate 110 with a ferrous material helps to substantially attenuate H-fields generated by the SCR. Other materials (e.g., silver ink) are prone to attenuate E-fields instead. Since the shrinkable composite laminate 110 comprises two independent surfaces, it will be appreciated that one surface may be coated with a conductive material for suppressing E-fields and the other surface with a conductive material for suppressing H-fields. Through this combination EMI may be further attenuated.

Figure 6:
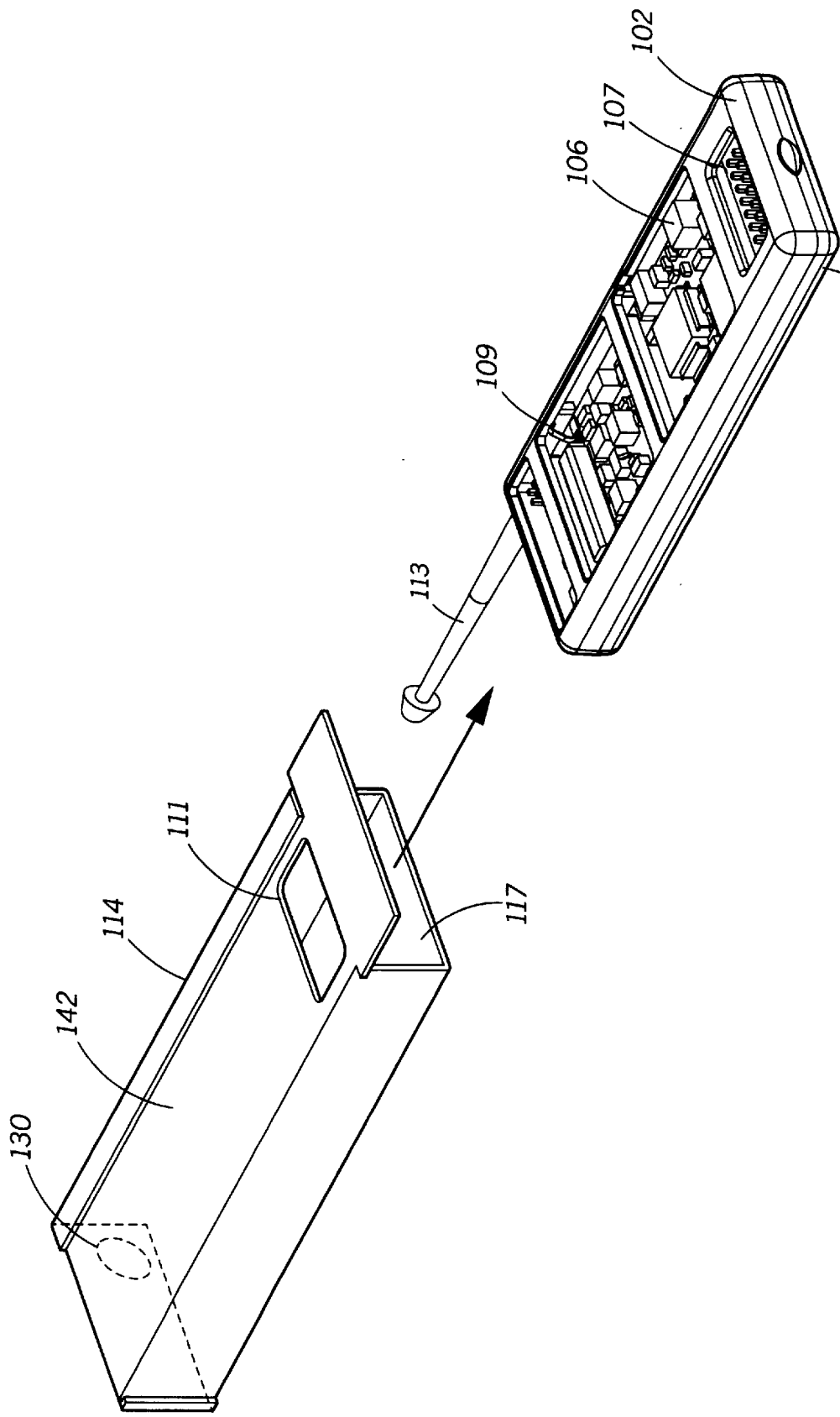
Figure 8:
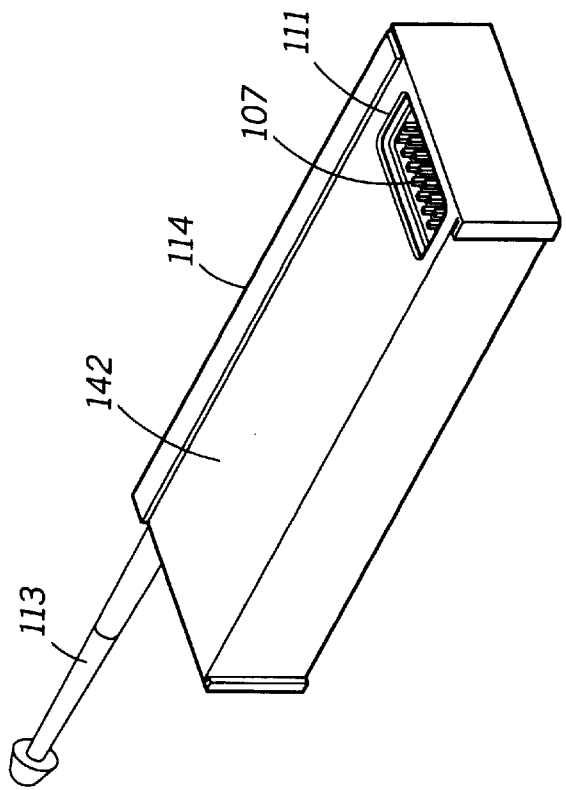
Figure 7:
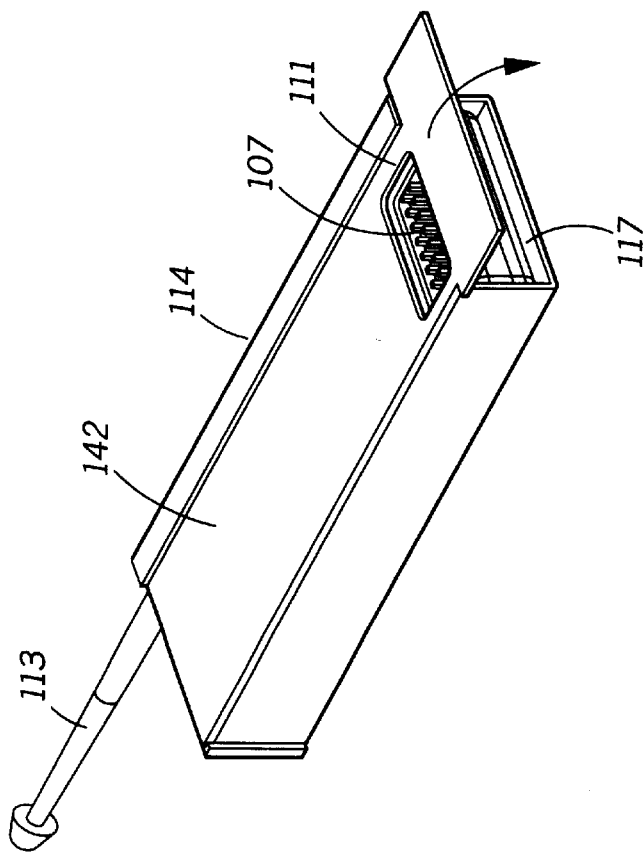

FIGS. 5–8 show block diagrams of a second embodiment of an assembly that shields EMI generated by electrical components 106 and that contemporaneously enhances the performance of the radio antenna 113 according to the present invention. In this embodiment, the assembly comprises a sheet of shrinkable composite laminate 114 shaped in a manner that can be made to conform to the contours of the SCR. The sheet of shrinkable composite laminate 114 includes two apertures 111, 130, one to expose connector 107 and the other to expose the antenna 113. As a first assembly step, the sheet of shrinkable composite laminate 114 is folded as shown in FIG. 6 leaving an orifice at one end for inserting the SCR. Once the SCR has been inserted into the enclosure, as shown in FIG. 7, the opened lid is folded in the closed position as shown in FIG. 8. Heat is then applied, thereby shrinking the sheet of shrinkable composite laminate 114 to the contours of the SCR.

As in the first embodiment, the shrinkable composite laminate 114 is coated with a conductive material on its inner surface 117 that couples to the conductive contacts 109 of the PCB 104. It will be appreciated that additional contacts 109 may be used. It will also be appreciated that ferrous material may be applied to the outer surface 142 of the sheet of shrinkable composite laminate 114 to substantially eliminate H-fields as well.

Although not shown in FIGS. 1–8, it will be appreciated that the assembly of the first and second embodiments can be modified as follows. The SCR can be assembled without the front and back covers 102,108, in which case, the PCB 104 and its corresponding components 106 is assembled with a shrinkable composite laminate 110, 114. Under this alternative embodiment, the inner surface 115, 117 of the shrinkable composite laminate 110, 114 is not laminated with any conductive materials. Instead, the outer surface 140,142 is coated with a conductive coating, which in turn is coupled to an external conductive contact of, for example, a cover or frame that electrically couples the conductive coating of the shrinkable composite laminate 110, 114 to ground. This embodiment in effect provides the same benefits as the embodiment discussed above for FIGS. 1–8.

Although the first and second embodiments described above each comprise an antenna 113 coupled to the shrink composite laminate 110, 114 in a manner that forms one or more voltage reference (e.g., ground) planes, it will be appreciated by one of ordinary skill in the art that the shrink composite laminate 110, 114 of each embodiment need not be coupled in this manner. That is, the antenna 113 and the shrink composite laminate 110, 114 may be coupled to independent voltage references without departing from scope of the present invention.

FIGS. 9–11 show block diagrams of yet a third embodiment of an assembly that shields EMI generated by electrical components 106 according to the present invention. In this embodiment, one or more electrical components 106 are enclosed by a shrinkable composite laminate 120. The shrinkable composite laminate 120 is laminated on its inner surface 121 with a conductive material that attenuates E-fields or, alternatively, a conductive ferrous material for attenuating H-fields. The shell of each electrical component 106 is composed, for example, of a conductive material such as, for example, a metallic shell for electrically coupling to the inner surface 121 of the shrinkable composite laminate 120. It will be appreciated that other methods for coupling the electrical component 106 to the shrinkable composite laminate 120 may be used. Such as, for example, laminating the outer surface 144 of the shrinkable composite laminate 120 with a conductive material and coupling it to an external ground source.

The metallic shell of the electrical component 106 is preferably coupled to a predetermined voltage potential such as, for example, a ground signal. There are several well-known methods in the art for electrically coupling the metallic shell of the electrical component 106 to the predetermined voltage. For example, one or more of the conductive pins 118 of the electrical component 106 may be coupled to the metallic shell of the electrical component 106 and also to a conductive contact 116 of the PCB 104 (see FIG. 11). The contact 116 in turn may be coupled to a predetermined signal such as ground. It will be appreciated that other methods suitable to the present invention for electrically coupling the metal shell of the electrical component 106 to a predetermined signal may be used.

Turning attention to the assembly process, the first step is shown in FIG. 10, where the electrical component 106 is inserted in the shrinkable composite laminate 120. This portion of the assembly is then exposed to heat, which causes the shrinkable composite laminate 120 to reduce in size and conform to the contours of the electrical component 106. The assembly is completed by coupling the pins 118 of the electrical component 106 with a corresponding set of conductive contacts 116 of the PCB 104 in a manner well-known in the art.

This embodiment serves several purposes. First, it substantially attenuates electromagnetic radiation, thereby conforming with FCC EMI standards. As a secondary effect, it helps to eliminate signal distortion between signals and electrical components 106 of the PCB 104. Third, this embodiment provides freedom to manufacture electrical components 106 at a lower cost by eliminating complex and expensive packaging methods of integrated circuit components that are known to radiate EMI. Lastly, it will be appreciated that the embodiments described in FIGS. 1–11 may be combined in any manner with the purpose of substantially eliminating EMI and signal distortion within the circuits of a SCR.

It will be appreciated that, alternatively, the third embodiment of the present invention may be modified to an alternative embodiment as follows. Instead of designing the electrical component 106 to electrically couple with the conductive coating of the inner surface 121 of the shrink composite laminate 120, the shrink composite laminate 120 may be modified so that its outer surface 144 is the surface coated with a conductive material. With the conductive coating on its outer surface 144, the shrink composite laminate 120 can be electrically coupled to ground or any other voltage by way of physical contact to an external source such as, for example, a cover or frame having an conductive contact coupled to a known voltage and aligned with the shrinkable composite laminate 120 as part of the assembly process. This alternative embodiment has the advantage of eliminating the need for constructing an electrical component 106 with a conductive shell. As a result, this embodiment is applicable for use with the majority of four-sided integrated circuit packages having conductive pins on only two parallel sides.

The foregoing embodiments described in FIGS. 1–11 have been shown to be an effective method for shielding EMI. It will be appreciated, however, that these embodiments are also useful for shielding against external electromagnetic interference that would otherwise adversely effect the function of an SCR. For example, when mating the alternative embodiments of the assembly shown FIGS. 4 and 8 by way of the connector 107 to an external electronic device such as, for example, a PDA. Under this circumstance, the SCR and the PDA are in effect shielded from each other. That is, the SCR is shielded from generating EMI that may be harmful to the operation of the PDA, and the SCR is shielded from receiving harmful EMI from the PDA as well.

Figure 12:
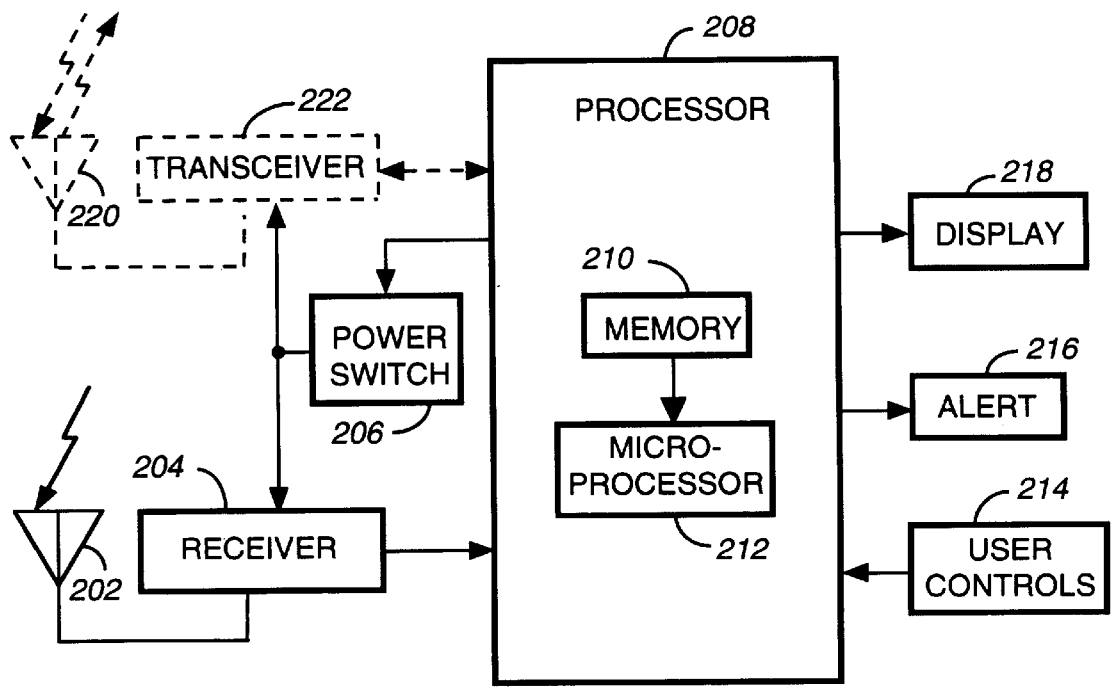
FIG. 12 shows an electrical block diagram of a SCR (selective call receiver) or, alternatively, a SCT (selective call transceiver) assembled by way of any one of the foregoing embodiments shown in FIGS. 1–11 according to the present invention.

FIG. 12 shows an electrical block diagram 200 of a SCR or, alternatively, a SCT assembled by way of any one of the foregoing embodiments shown in FIGS. 1–11 according to the present invention. The SCR comprises an antenna 202 for intercepting RF signals from, for example, a radio communication system (not shown). The antenna 202 is coupled to a receiver 204 employing conventional demodulation techniques for receiving the communication signals transmitted by the radio communication system. Radio signals received by the receiver 204 produce demodulated information, which is coupled to a processor 208 for processing received messages. A conventional power switch 206, coupled to the processor 208, is used to control the supply of power to the receiver 204, thereby providing a battery saving function.

To perform the necessary functions of the SCR, the processor 208 includes a microprocessor 212, and a memory 210 that includes a random access memory (RAM), a read-only memory (ROM), and an electrically erasable programmable read-only memory (EEPROM). Preferably, the processor 208 is similar to the M68HC08 microcontroller manufactured by Motorola, Inc. It will be appreciated that other similar processors can be utilized for the processor 208, and that additional processors of the same or alternative type can be added as required to handle the processing requirements of the processor 208.

The processor 208 is programmed by way of the ROM to process incoming messages transmitted by the radio communication system. The processor 208 decodes an address in the demodulated data of the received message, compares the decoded address with one or more addresses stored in the EEPROM, and when a match is detected, proceeds to process the remaining portion of the message. Once the processor 208 has processed the message, it stores the message in the RAM, and a call alerting signal is generated to alert a user that a message has been received. The call alerting signal is directed to a conventional audible or tactile alerting device 216 for generating an audible or tactile call alerting signal.

The message can be accessed by the user through user controls 214, which provide functions such as lock, unlock, delete, read, etc. More specifically, by the use of appropriate functions provided by the user controls 214, the message is recovered from the RAM, and conveyed to the user by way of a display 218 (e.g., a conventional liquid crystal display (LCD)). It will be appreciated that, alternatively, the display 218 can be accompanied by an audio circuit (not shown) for conveying voice messages also.

Alternatively, the SCT utilizes a transceiver 222 and a corresponding transceiver antenna 220 (both shown with phantom lines). Each of these elements comprises conventional circuits for transmitting and receiving radio signals to and from a radio communication system. In this embodiment, the processor 208 performs the additional function of constructing messages to transmit to the radio communication system. The process of receiving and processing messages is substantially similar to the functions described for the SCR above.

The embodiments of the present invention shown in FIGS. 1–11 are preferably employed in the manufacture of the SCR and the SCT. These embodiments provide the advantage of preventing the SCR and the SCT from violating FCC EMI regulations and eliminating the signal distortion internal to these devices. In addition, any of the embodiments shown in FIGS. 1–8 provide the advantage of enhancing the performance of the SCR and SCT antennas. In sum, the present invention reduces the cost of manufacturing of SCR's and SCT's, and based on its simplicity, improves the quality of manufacture of the same.

Although the invention has been described in terms of a plurality of embodiments it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A housing assembly, comprising:

a printed circuit board;

at least one electrical component mounted on at least one side of the printed circuit board and electrically coupled thereto;

a frame for surrounding selected portions of the printed circuit board; and a heat shrinkable composite laminate, having an inner conductive surface, and an outer surface, for enclosing the printed circuit board and the at least one electrical component within the frame, and wherein the heat shrinkable composite laminate forms an enclosure supported by the frame about the printed circuit board and the at least one electrical component mounted thereon.

2. The housing assembly as recited in claim 1, wherein the printed circuit board comprises a flexible substrate.

3. The housing assembly as recited in claim 2, wherein the flexible substrate comprises a selected one of a polyimide substrate and a polyester substrate.

4. The housing assembly as recited in claim 1, wherein the at least one electrical component is a component of a communication device.

5. The housing assembly as recited in claim 4, further comprising an antenna electrically coupled to the communication device on the printed circuit board wherein the inner conductive surface of the heat shrinkable composite laminate serves as a ground plane for the antenna.

6. The housing assembly as recited in claim 4, further comprising at least one conductive contact coupled to the inner conductive surface of the heat shrinkable composite laminate, wherein the at least one conductive contact is mounted on the printed circuit board and couples the inner conductive surface to the printed circuit board.

7. The housing assembly as recited in claim 4, wherein the communication device comprises a selective call receiver.

8. The housing assembly as recited in claim 4, wherein the communication device comprises a selective call transceiver.

9. The housing assembly as recited in claim 1, wherein the inner conductive surface of the heat shrinkable composite laminate is formed by a silver ink.

10. The housing assembly as recited in claim 1, wherein the heat shrinkable composite laminate comprises a polymer film that shrinks when exposed to heat at or above a predetermined temperature.

11. The housing assembly as recited in claim 10, wherein the heat shrinkable composite laminate forms an enclosure having first and second orifices.

12. The housing assembly as recited in claim 10, wherein the heat shrinkable composite laminate comprises a sheet of heat shrinkable composite laminate shaped in a manner that conforms to contours of the frame surrounding the printed circuit board.

13. The housing assembly as recited in claim 1, further comprising:

an electrical connector mounted on the printed circuit board, wherein a portion of the heat shrinkable composite laminate is cut away to expose the electrical connector, thereby permitting the electrical connector to make contact with other circuitry.

14. The housing assembly as recited in claim 1, wherein the outer surface of the heat shrinkable composite laminate is non-conductive.

15. The housing assembly as recited in claim 1, wherein the outer surface of the heat shrinkable composite laminate is conductively coated.

* * * * *